United States Patent
Vats et al.

(10) Patent No.: US 11,276,570 B2
(45) Date of Patent: Mar. 15, 2022

(54) MULTI-LAYER DEPOSITION AND TREATMENT OF SILICON NITRIDE FILMS

(71) Applicant: Applied Materials, Inc., Santa Clara, CA (US)

(72) Inventors: Vinayak Veer Vats, San Ramon, CA (US); Byung Kook Ahn, Hwaseong-si (KR); SeoYoung Lee, Hwaseong-si (KR); Hang Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 72 days.

(21) Appl. No.: 16/935,423

(22) Filed: Jul. 22, 2020

(65) Prior Publication Data

US 2022/0028680 A1    Jan. 27, 2022

(51) Int. Cl.
*H01L 21/02* (2006.01)
*C23C 16/56* (2006.01)
*C23C 16/50* (2006.01)
*C23C 16/34* (2006.01)

(52) U.S. Cl.
CPC ........ *H01L 21/0234* (2013.01); *C23C 16/345* (2013.01); *C23C 16/50* (2013.01); *C23C 16/56* (2013.01); *H01L 21/0217* (2013.01); *H01L 21/0228* (2013.01); *H01L 21/02211* (2013.01); *H01L 21/02274* (2013.01)

(58) Field of Classification Search
None
See application file for complete search history.

(56) References Cited

U.S. PATENT DOCUMENTS

| | | | | |
|---|---|---|---|---|
| 2012/0009802 A1* | 1/2012 | LaVoie | ................. | C23C 16/4554 438/783 |
| 2012/0276752 A1* | 11/2012 | Rangarajan | ....... | H01L 21/31144 438/761 |
| 2013/0210241 A1* | 8/2013 | LaVoie | .............. | H01L 21/02211 438/791 |
| 2014/0256153 A1* | 9/2014 | Grill | .................... | H01L 21/0217 438/762 |
| 2016/0155676 A1* | 6/2016 | Kang | .................. | H01L 21/0217 438/5 |
| 2018/0005814 A1* | 1/2018 | Kumar | .............. | H01L 21/02274 |

* cited by examiner

*Primary Examiner* — Asok K Sarkar
(74) *Attorney, Agent, or Firm* — Kilpatrick Townsend & Stockton LLP

(57) ABSTRACT

Exemplary processing methods may include forming a first deposition plasma of a silicon-and-nitrogen-containing precursor. The methods may include depositing a first portion of a silicon nitride material on a semiconductor substrate with the first deposition plasma. A first treatment plasma of a helium-and-nitrogen-containing precursor may be formed to treat the first portion of the silicon nitride material with the first treatment plasma. A second deposition plasma may deposit a second portion of a silicon nitride material, and a second treatment plasma may treat the second portion of the silicon nitride material. A flow rate ratio of helium-to-nitrogen in the first treatment plasma may be lower than a He/$N_2$ flow rate ratio in the second treatment plasma. A first power level from a plasma power source that forms the first treatment plasma may be lower than a second power level that forms the second treatment plasma.

20 Claims, 5 Drawing Sheets

MULTI-LAYER DEPOSITION AND TREATMENT OF SILICON NITRIDE FILMS

TECHNICAL FIELD

The present technology relates to semiconductor processing. More specifically, the present technology relates to methods of depositing and treating materials including silicon nitride films.

BACKGROUND

Integrated circuits are made possible by processes which produce intricately patterned material layers on substrate surfaces. Producing patterned material on a substrate requires controlled methods of formation and removal of exposed material. As device sizes continue to shrink and become more complex, material formation may affect subsequent operations. For example, in barrier layer formation operations a material may be formed or deposited to create a barrier layer in a trench or other feature formed on a semiconductor substrate. As features may be characterized by reduced critical dimensions, lower thermal budgets, higher sensitivities to contaminants, and higher sensitivities to stresses, these barrier formation operations may be challenged. For example, the treatment of a deposited barrier layer may require high-temperature thermal annealing that exceeds the thermal budget of the device being formed on or in the semiconductor substrate. In additional examples, the deposited barrier layer may require a high power plasma treatment that creates voids and particles in and around the feature formed in the semiconductor substrate. Thermal annealing, plasma treatments, and other kinds of treatments can also change the spatial dimensions of the as-deposited material, which can place stresses on the adjacent substrate features. On the other hand, inadequate treatment of the as-deposited material can produce a pervious barrier layer with poor hermeticity. This can impact device performance and subsequent processing operations.

Thus, there is a need for improved systems and methods that can be used to produce high quality devices and structures. These and other needs are addressed by the present technology.

SUMMARY

The present technology may be used to form a barrier film having high hermeticity and mechanical strength while avoiding the unwanted voids, particles, and high stresses encountered by conventional barrier film forming methods. The present technology includes exemplary processing methods to deposit and treat successive portions of a barrier material, such as a silicon nitride material, to form the barrier film. Earlier portions of the barrier material may be treated with a more energetic treatment plasma formed from a treatment gas mixture with a higher flow rate ratio of helium-to-nitrogen gas than later portions of the barrier material. The more energetic and helium-rich earlier treatments produce a treated portion of barrier material with a higher density and hermeticity, than a subsequently treated portion of barrier material. When the barrier material includes silicon nitride, the earlier treated portions also have more Si—N bonds and fewer Si—H bonds than an equivalent amount of a subsequently treated portion of the silicon nitride barrier material.

Exemplary processing methods of the present technology produce a barrier film built up from successively deposited and treated portions of barrier material. The earlier deposited and treated portions of the barrier material in the barrier film have a higher density, hermeticity, and stress, than later deposited and treated portions. This gives the barrier film a high hermeticity close to the interface with semiconductor substrate, while reducing the overall stress the barrier film generates may affect the surrounding substrate and substrate features. For example, subsequent layers may deposited with an opposite kind of stress (e.g., a subsequent layer deposited with tensile stress to counterbalance an underlying layer with compressive stress) neutralize the overall stress of the layers. In some embodiments, the later-deposited portions of the barrier material may be larger (e.g., thicker) and more rapidly deposited than the earlier portions of the barrier material to reduce the overall production time for completing the barrier film. In further embodiments, the larger and more rapidly deposited later portions may fill openings (e.g., pinholes) in the earlier-deposited portions. The lower-energy and lower helium-to-nitrogen flow rate ratios used during the treatment operations of these later-deposited portions of the barrier material minimize the generation of voids and particles in these portions.

Exemplary processing methods include the formation of a barrier film that comprises silicon nitride. These processing methods may include a number of deposition and treatment cycles each of which includes a deposition operation and a treatment operation to form a treated portion of silicon nitride barrier material. The deposition operations may include forming a deposition plasma of one or more deposition precursors that include a silicon-containing precursor and a nitrogen-containing precursor. In some instances, the silicon-containing precursor and the nitrogen containing precursor are the same precursor (e.g., an amino silane precursor). In additional instances, the silicon-containing precursor and the nitrogen-containing precursors are different precursors combined together (e.g., silane and ammonia). The methods may further include depositing a portion of silicon nitride barrier material on a semiconductor substrate with plasma effluents of the one or more deposition precursors.

The treatment operation that follows each deposition operation may include forming a treatment plasma of a treatment gas mixture that comprises helium and nitrogen gases. The treatment plasma may be formed by energizing (i.e., striking) the treatment gas mixture with a plasma power source that is set to a power level. An earlier portion of deposited silicon nitride material may be treated with a treatment plasma formed of a treatment gas mixture that has a higher helium-to-nitrogen flow rate ratio that is energized by the plasma power source set to a higher power level than a subsequently deposited and treated portion of the silicon nitride material.

After a number of deposition and treatment cycles are performed, the barrier film comprising silicon nitride may be completed. The number of deposition and treatment cycles performed to complete the barrier film may include at least two cycles, at least three cycles, at least four cycles, at least five cycles, at least ten cycles, at least twenty cycles, at least thirty cycles, at least forty cycles, at least fifty cycles, at least sixty cycles, at least seventy cycles, at least eighty cycles, at least ninety cycles, at least one hundred cycles, among other ranges.

Such technology may provide numerous benefits over conventional systems and techniques. For example, by performing a treatment operation according to embodiments of the present technology, void and particle formation caused by the formation of the barrier layer can be limited or controlled. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
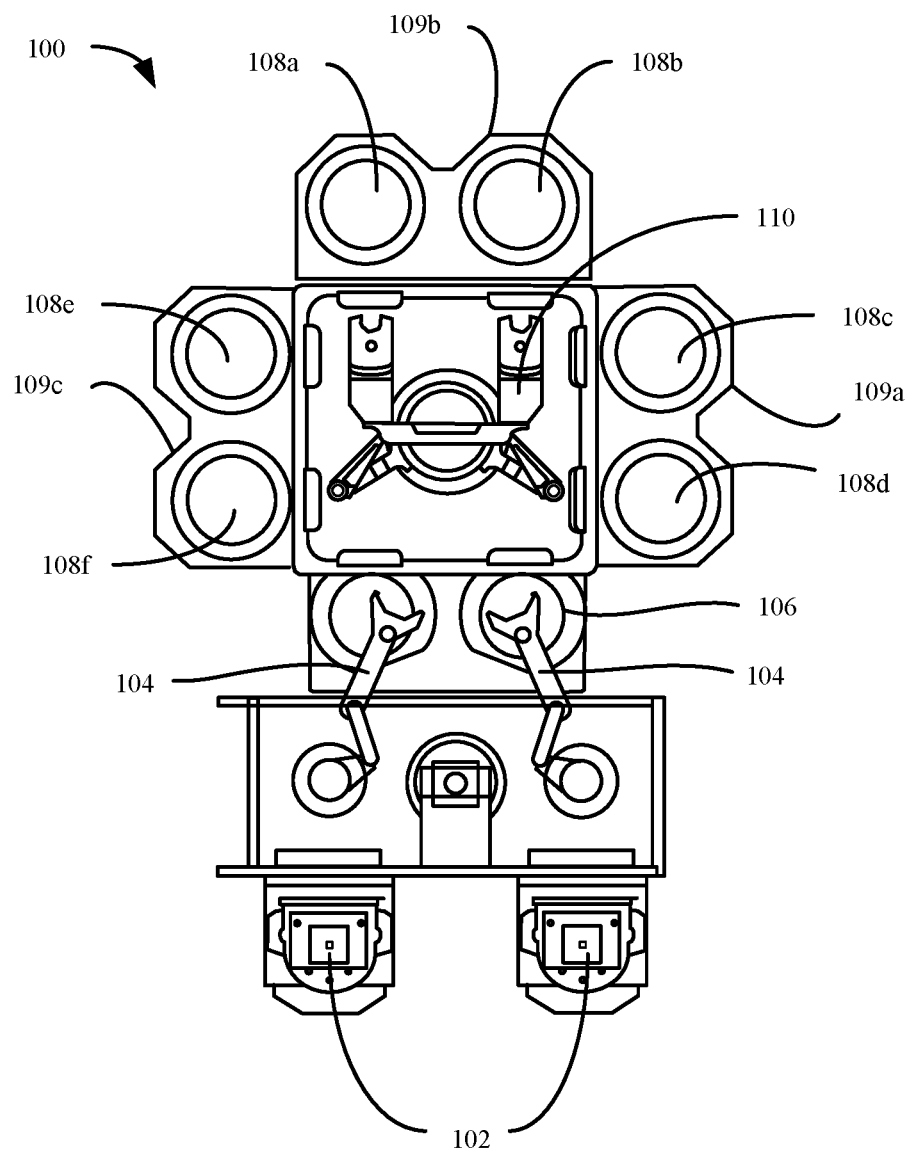
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes processing methods and systems to form a barrier film on a semiconductor substrate. Embodiments of the processing methods and systems include methods and systems to form a barrier film comprising silicon nitride on a semiconductor substrate. Silicon-nitride-containing materials may be used in semiconductor device manufacturing for a number of structures and processes, including as a barrier material, for example as a charge trap material, an encapsulation material, a dielectric barrier material, and etch stop material, among other functions. These silicon-nitride barrier films may be permanently or temporarily incorporated into semiconductor device structures that include dynamic random access memory (DRAM) devices, static random access memory (SRAM) devices, and phase-change random access memory (PRAM) devices, among other types of semiconductor devices.

Conventional processing methods of forming silicon nitride barrier films utilize low-temperature, plasma-enhanced chemical-vapor-deposition (PECVD) to form a silicon-nitride barrier material having a high hydrogen content (e.g., SiNH) that aids in the formation of a conformal layer on a semiconductor substrate that may have one or more features. The initially-formed silicon nitride material on the semiconductor substrate is then treated to remove a portion of the hydrogen and form a barrier film with increased hermeticity. Treatment operations include high-temperature thermal annealing and high-energy plasma treatments that both create processing defects in the semiconductor device structure being formed. These defects include thermal breakdown of materials and structures when a high-temperature anneal exceeds the thermal budget of the forming semiconductor device. They also include the formation of voids, particles, and high stresses when a high-energy plasma treatment rapidly disrupts many Si—H bonds in the as-deposited silicon nitride material. These defects, and others, are regularly encountered in conventional processing methods of forming silicon nitride barrier films with high hermeticity in a single deposition and treatment cycle. They are also encountered in conventional processing methods that deposit and treat successive layers of the silicon nitride barrier film with relatively constant treatment conditions between cycles. As feature sizes continue to shrink and substrate features continue to become more complex, the defects created by conventional processing methods of forming silicon nitride barrier films increase device failure rates.

The present technology includes processing methods and systems that reduce or eliminate these defects by forming a silicon-nitride barrier film in two or more parts that have decreasing hermeticity. In some embodiments a first portion of the deposited and treated barrier film is characterized by a high hermeticity, while at least a second portion is characterized by a lower hermeticity. However, the higher plasma power and higher helium concentration treatment may increase bubble formation. In further embodiments, a silicon-nitride barrier film formed on a substrate is where a portion of the film closest to the substrate is characterized by the highest hermeticity and a portion of the film furthest from the substrate is characterized by the lowest hermeticity, which may be in part related to lower treatment powers and reduced helium in the treatment precursors. In still further embodiments, the silicon-nitride barrier film may be characterized by a hermeticity gradient from highest hermeticity where the film is closest to the substrate, to lowest hermeticity where the film is furthest from the substrate.

Embodiments of the present technology include depositing and treating successive portions of a silicon-nitride-containing material to form a silicon-nitride layer (e.g., a SiN barrier film) with two or more levels of decreasing hermeticity. In some embodiments, the successive portions of the silicon-nitride-containing material may also be characterized by decreasing numbers of voids created by the formation of bubbles of hydrogen and/or helium during the deposition and treatment. The successive portions of the silicon-nitride-containing material may be deposited and treated using a set of processing conditions that differ between portions. These processing conditions may include a helium-to-nitrogen flow rate ratio for a treatment gas mixture that forms a treatment plasma, a power level used to form a treatment plasma, and a deposition rate for a deposited portion of silicon-nitride-containing material, among other processing conditions. Embodiments of the present technology include the treatment of an initial portion of deposited silicon-nitride containing material at a higher plasma power and a higher helium-to-nitrogen flow rate ratio to remove more hydrogen and make the material more hermetic. Subsequently deposited portions of the silicon-nitride containing material are treated at lower plasma powers and lower helium-to-nitrogen flow rate ratios which reduces the formation of voids from dissociated hydrogen and helium in the treated material. These subsequent treatments may leave a higher hydrogen content that makes the material less hermetic. After describing general aspects of a chamber according to some embodiments of the present technology in which plasma processing operations discussed below may be performed, specific methodology may be discussed. It is to be understood that the present technology is not intended to be limited to the specific films, chambers, or processing discussed, as the techniques described may be used to improve a number of barrier film formation processes, and may be applicable to a variety of processing chambers and operations.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing, densifying and/or etching a dielectric, barrier, or other film on the substrate. In one configuration, two pairs of the processing chambers, e.g., 108c-d and 108e-f, may be used to deposit material on the substrate, and the third pair of processing chambers, e.g., 108a-b, may be used to etch the deposited material. In another configuration, all three pairs of chambers, e.g., 108a-f, may be configured to deposit stacks of alternating films (e.g., dielectric films, barrier films, etc.) on the substrate. Any one or more of the processes described may be carried out in chambers separated from the fabrication system shown in different embodiments. It will be appreciated that additional configurations of deposition, etching, annealing, curing, and densifying chambers for dielectric films are contemplated by system 100.

Figure 2:
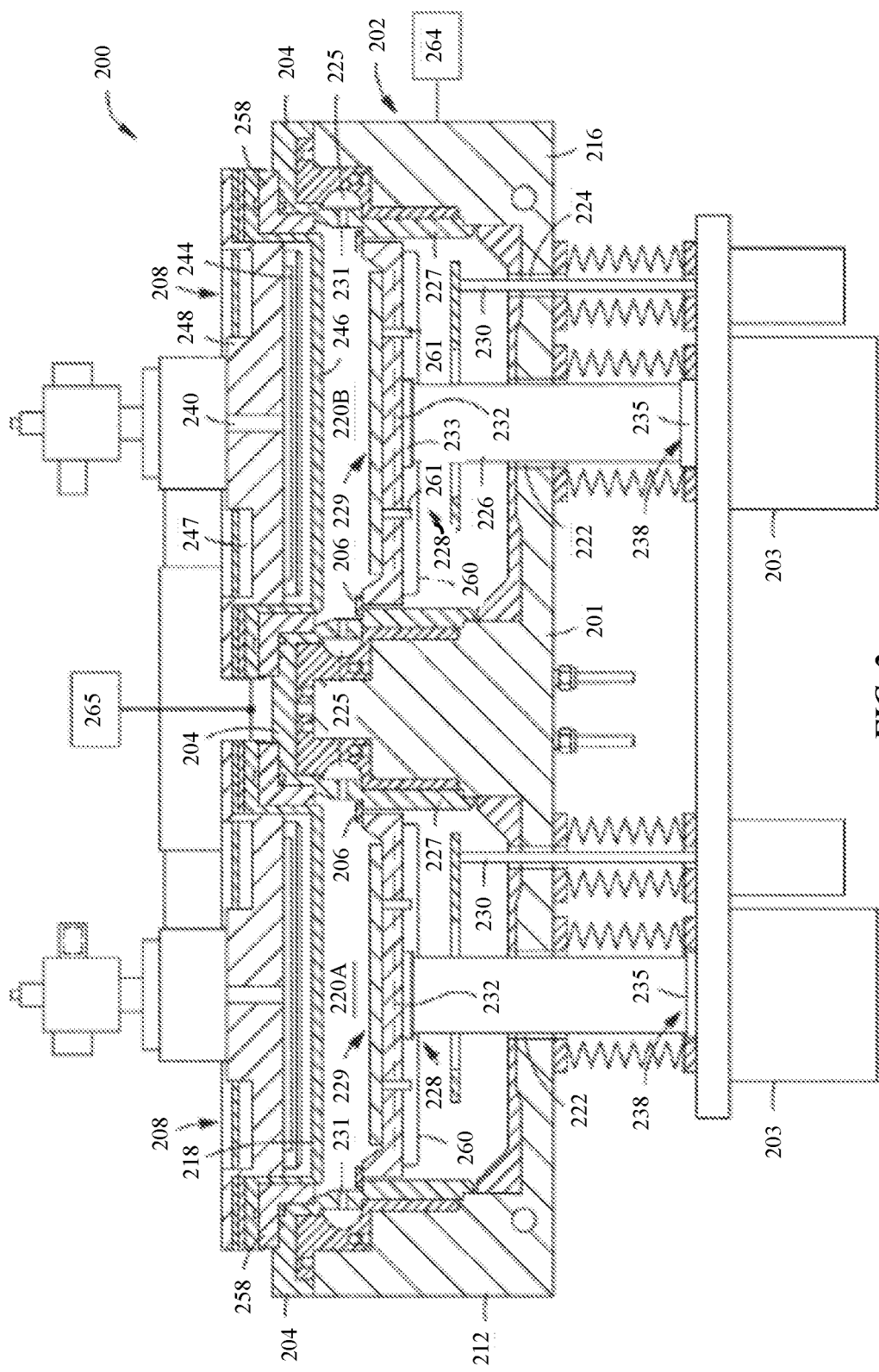
FIG. 2 shows a schematic cross-sectional view of an exemplary processing chamber according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include components or assemblies specifically configured to perform processes according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227.

The exhaust ports 231 may be configured to allow the flow of gases from the processing region 220B to the circumferential pumping cavity 225 in a manner that promotes processing within the system 200.

Figure 3:
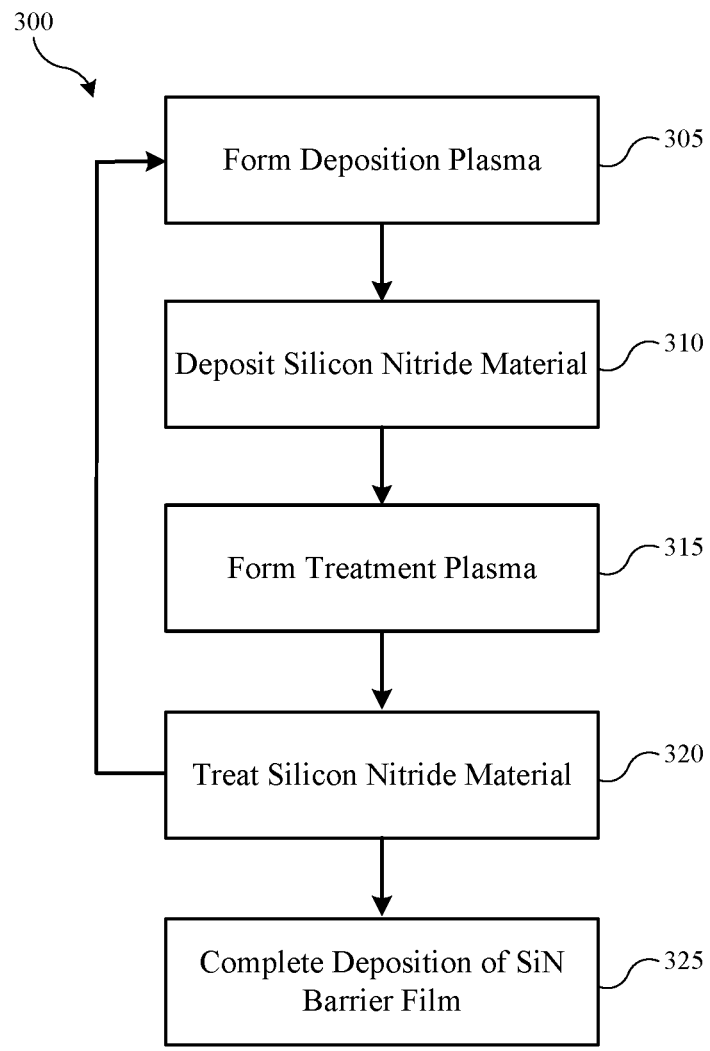
FIG. 3 shows exemplary operations in a processing method according to some embodiments of the present technology.

FIG. 3 shows exemplary operations in a processing method 300 according to some embodiments of the present technology. The method may be performed in a variety of processing chambers, including plasma system 200 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may involve optional operations to develop the semiconductor structure to a particular fabrication operation. Although in some embodiments method 300 may be performed on a base structure, in some embodiments the method may be performed subsequent other material formation or removal. For example, any number of deposition, masking, or removal operations may be performed to produce any transistor, memory, or other structural aspects on a substrate. In some embodiments one or more structures formed on a substrate may be characterized by a thermal budget of less than or about 500° C., less than or about 450° C., less than or about 400° C., less than or about 350° C., less than or about 300° C., less than or about 250° C., less than or about 200° C., or less than or about 150° C. or less. Accordingly, method 300 and any subsequent operations may be performed at temperatures that are at or below the structural thermal budget. The substrate may be disposed on a substrate support, which may be positioned within a processing region of a semiconductor processing chamber. The operations to produce the underlying structures may be performed in the same chamber in which aspects of method 300 may be performed, and one or more operations may also be performed in one or more chambers on a similar platform as a chamber in which operations of method 300 may be performed, or on other platforms.

In some embodiments, method 300 may include forming a silicon nitride barrier film on a substrate. The methods may include forming a deposition plasma in a processing region where a substrate is housed at operation 305. The formation of the deposition plasma may include providing one or more deposition precursors including a silicon-containing precursor. In some instances, the silicon-containing precursor also includes one or more nitrogens (e.g., an amino-silane such as tri-silyl amine), and the silicon-precursor supplies both silicon and nitrogen groups to the deposited portion of the silicon nitride barrier material. In additional instances, the silicon-containing precursor may not include a nitrogen group (e.g., a silane such as $SiH_4$) and one or more nitrogen-containing precursors (e.g., ammonia) may be combined with the nitrogen-free silicon-containing precursor to form the deposition precursor. The one or more deposition precursors may be delivered with a carrier gas, including an inert precursor, such as helium, argon, and/or nitrogen ($N_2$), for example. If nitrogen is used as a carrier gas for the deposition precursors, it may also be incorporated, to at least some extent, in the as-deposited silicon nitride containing material.

In some embodiments, the flow rate of the silicon-containing precursor (e.g., TSA) supplying the deposition plasma may range from 10 standard cubic centimeters per minute (sccms) to 100 sccm. If an additional deposition precursor (e.g., $NH_3$) is provided to the deposition plasma, it may be provided at a flow rate of 50 sccm to 150 sccm. If a carrier precursor (e.g., $N_2$) is provided to the deposition plasma, it may be provided at a flow rate of 0.2 standard liters per minute (slm) to 4 slm. The deposition plasma may be formed in a processing region of a semiconductor processing chamber. A portion of the perimeter of the processing region may include a surface of the semiconductor substrate exposed to the deposition plasma and a faceplate of the semiconductor processing chamber. In some embodiments, the distance between the substrate and the faceplate may range from 200 mils to 500 mils.

The formation of a deposition plasma in operation 305 may include energizing the deposition precursors with a source of radio-frequency (RF) power. In some embodiments, the amount of RF power supplied to the deposition precursors may range from 60 Watts (W) to 200 Watts. In some embodiments, the plasma formation process may include pulsing the plasma power during plasma generation. The plasma may be generated at a plasma-generation frequency, such as 13.56 MHz in one non-limiting example. The plasma power may also be pulsed at a pulsing frequency that may be less than or about 10 kHz, and may be less than or about 9 kHz, less than or about 8 kHz, less than or about 7 kHz, less than or about 6 kHz, less than or about 5 kHz, less than or about 4 kHz, less than or about 3 kHz, less than or about 2 kHz, less than or about 1 kHz, or less. The duty cycle of the pulsing frequency may provide an amount of "off" time for the plasma generation.

During plasma "off" periods, deposition may not be occurring. While previously formed ions may quickly extinguish, radical species may still contact the substrate and transfer energy into the barrier film being produced. This may activate and break bonds within the barrier film, which may in turn cause the formation of gaseous species that are removed from the depositing film. At high duty cycle, insufficient time may be afforded for this effect before deposition resumes. Accordingly, in some embodiments, the duty cycle may be maintained at less than or about 50%, and may be maintained at less than or about 45%, less than or about 40%, less than or about 35%, less than or about 30%, less than or about 25%, less than or about 20%, less than or about 15%, less than or about 10%, less than or about 5%, or less. Any of these techniques, alone or in combination, may reduce hydrogen incorporation in the as-deposited silicon nitride material.

A deposition plasma may be struck of the deposition precursors flowed into the processing region, and a portion of silicon-nitride material may be deposited on the substrate at operation 310. The portion of silicon nitride material may be deposited on the semiconductor substrate while the substrate is housed in a processing region of a semiconductor processing chamber. The semiconductor substrate may define one or more features within the semiconductor substrate. The portion of the silicon nitride material may be deposited in one or more of the features of the semiconductor substrate as well as on portions of the substrate that have not been etched or otherwise shaped by a substrate feature. The processing region may be at least partially defined between a faceplate and a substrate support on which the semiconductor substrate is seated.

In some embodiments, the deposition of the portion of silicon nitride material may be on a semiconductor substrate having a thermal budget less than or about 550° C., less than or about 500° C., less than or about 450° C., less than or about 400° C., less than or about 350° C., less than or about 300° C., less than or about 250° C., less than or about 200° C., or less than or about 150° C., or less. Accordingly, the silicon nitride material may be deposited at or below any of these temperatures to accommodate the underlying materials, and in some embodiments one or more operations, including all operations of method 300, may be performed at or below any of these temperatures, and a substrate being processed may be maintained below or about any of these temperatures throughout processing. In some embodiments, the deposition temperature for the silicon nitride material on the substrate may range from 200° C. to 300° C. (e.g., a deposition temperature range of 250° C. to 280° C.). Processing pressures during the deposition of the silicon-nitride-containing material may be greater than or about 30 mTorr in some embodiments, and may be between about 30 mTorr and about 20 Torr.

The portion of silicon-nitride-containing material may be deposited with deposition precursors that include silicon, nitrogen, and hydrogen atoms. Consequently, an as-deposited portion of the silicon nitride material may be characterized by a first amount of incorporated hydrogen. This first amount of incorporated hydrogen may be greater than or about 3 at. %, greater than or about 5 at. %, greater than or about 7 at. %, greater than or about 10 at. %, or more.

The as-deposited portion of the silicon nitride material may be further treated in a treatment process that may increase the density and hermeticity of the material. The treatment process may be performed in the same chamber as the deposition, or the substrate may be transferred from a first processing chamber to a second processing chamber. In some embodiments, the second chamber may be on the same tool, such as previously described, and the transfer may be performed while maintaining vacuum conditions for the substrate. The treatment process may be configured to reduce the amount of hydrogen incorporated in the as-deposited silicon nitride material by transferring additional energy into the as-deposited material, and breaking bonds of hydrogen groups to other atoms such as silicon, nitrogen, and carbon atoms. This may reduce an amount of hydrogen in the as-deposited material from a first amount to a second, lower amount of hydrogen in the material after a treatment operation. The second amount of hydrogen incorporation may less than or about 2 at. %, and may be less than or about 1.5 at. %, less than or about 1.0 at. %, less than or about 0.5 at. % or less.

The treatment of the as-deposited silicon-nitride-containing material may include the formation of a treatment plasma at operation 315. The formation of the treatment plasma may include providing one or more treatment precursors, such as a mixture of helium and nitrogen ($N_2$) gases. A plasma may be struck from the treatment precursors flowed into the processing region, and the plasma effluents, such as helium and nitrogen ions ($N^+$, $N_2^+$), may contact the deposited silicon nitride material. The impact energy of at least some of the plasma effluents contacting the deposited silicon nitride material may exceed a threshold energy for breaking bonds of hydrogen groups embedded in the silicon nitride material. At least some of the separated hydrogen groups may reformulate as species that are removed from the silicon nitride material. For example, at least some of the separated hydrogen groups may reformulate as molecular hydrogen ($H_2$) that is removed from the silicon nitride material. In some instances, the effluents of the treatment plasma break silicon-and-hydrogen bonds and replace the displaced hydrogen group with a nitrogen group that forms new silicon-nitrogen bonds in the silicon nitride material. Both the reduction in the number of silicon-hydrogen bonds and the increase in the number of silicon-nitrogen bonds densify the silicon nitride material in operation 320.

In some embodiments, the formation of the treatment plasma at operation 315 includes providing treatment precursors as a mixture of helium and nitrogen ($N_2$) gases. A flow rate ratio of the helium to the nitrogen gases ($He:N_2$) may change between treatment cycles. For example, the flow rate ratio of helium-to-nitrogen gases (i.e., the $He:N_2$ flow rate ratio) for an earlier treatment operation following an earlier deposition of a portion of the silicon nitride material may be higher than the $He:N_2$ flow rate ratio for a later (e.g., subsequent) treatment process following a later deposition of a portion of the silicon nitride material. In some embodiments, the $He:N_2$ flow rate ratio may progressively decrease with each treatment plasma operation that is performed in a multilayer deposition of the silicon-nitride-containing barrier film. In additional embodiments, the $He:N_2$ flow rate ratio may progressively decrease with each treatment operation until reaching a lower limit of the $He:N_2$ ratio that remains the same for successive treatment plasma operations until the formation of the silicon-nitride-containing barrier film is completed. In some embodiments, the $He:N_2$ flow rate ratio may range from 0.1 to 10.

For example, from an initial flow rate ratio of Helium to nitrogen, successive treatment operations may successively reduce the helium flow rate, while successively increasing the nitrogen flow rate. For example, each successive treatment may reduce the helium flow rate by greater than or about 300 sccm, and may reduce the helium flow rate by greater than or about 400 sccm, greater than or about 500 sccm, greater than or about 600 sccm, greater than or about 700 sccm, greater than or about 800 sccm, greater than or about 900 sccm, greater than or about 1000 sccm, greater than or about 1100 sccm, greater than or about 1200 sccm, greater than or about 1300 sccm, greater than or about 1400 sccm, greater than or about 1500 sccm, or more. Similarly, each successive treatment may increase the nitrogen flow rate by greater than or about 500 sccm, and may increase the nitrogen flow rate by greater than or about 600 sccm, greater than or about 700 sccm, greater than or about 800 sccm, greater than or about 900 sccm, greater than or about 1000 sccm, greater than or about 1100 sccm, greater than or about 1200 sccm, greater than or about 1300 sccm, greater than or about 1400 sccm, greater than or about 1500 sccm, or more.

The higher flow rate ratio of helium to nitrogen gases, which in some embodiments may be done in conjunction with a higher power level to form the treatment plasma, may produce a treated silicon-nitride-containing material with a higher hermeticity as the large amount of high-energy helium dissociates more hydrogen in the deposited material. The free helium and hydrogen can create bubbles in the material that increase the number of voids in the treated material. In some embodiments, the amount of bubbles can be reduced or eliminated by depositing a portion of silicon-nitride containing material that is too thin for a significant number of bubbles to form (e.g., no bubbles form). Additional portions of the silicon-nitride containing material may be treated at lower flow rate ratios of helium-to-nitrogen gases, and in some embodiments lower power levels for the treatment plasma, to form treated portions with less dissociated hydrogen, lower hermeticity, and fewer voids. In some embodiments, these additional portions of the silicon-nitride-containing material may also be formed with greater thickness and higher deposition rates than the initial portion.

The final silicon-nitride layer may be characterized by decreasing hermeticity, and in some embodiments and decreasing number of voids, going from the initial to the final portion of the deposited and treated material.

The formation of the treatment plasma may also include energizing the treatment precursors with a source of RF power. In some embodiments, the RF power may be supplied continuously to the treatment precursors at a power ranging from 10 W to 1000 W. Additional RF power ranges include 100 W to 800 W, 200 W to 700 W, and 300 W to 600 W, among other ranges. The plasma may be generated at a plasma-generation frequency, such as 13.56 MHz in one non-limiting example. In some embodiments, the RF power level used to form an earlier treatment plasma that treats an earlier portion of as-deposited silicon nitride material may be greater than the RF power level used to form a later (e.g., subsequent) treatment plasma used to treat a later portion of as-deposited silicon nitride material. For example, the RF power level used to form the earlier treatment plasma may be 600 W and the RF power level used to form the later treatment plasma may be 500 W.

When a number of deposition and treatment cycles have been performed, the formation of the silicon-nitride-containing barrier film is completed at operation 325. In some embodiments the film may be formed in at least two deposition and treatment cycles, where a thickness of the first portion of the silicon nitride material deposited is less than the thickness of the second and subsequent portions of the deposited silicon nitride material. For example, the first portion of the silicon nitride material deposited on the substrate may be less than 50% of the thickness of the film, less than 40% of the thickness of the film, less than 30% of the thickness of the film, less than 20% of the thickness of the film, less than 10% of the thickness of the film, less than 5% of the thickness of the film, or less.

As noted above, in some embodiments a first portion of the silicon-nitride-containing barrier film may have a higher hermeticity than a second and, if included, subsequent portions of the barrier film. The first portion of the barrier film, which may be the portion closest to the substrate on which the barrier film is formed, may be characterized by a hermeticity that is greater than or about 10% higher than the hermeticity of a second portion of the barrier film or subsequent portion, greater than or about 15% higher than the hermeticity of a second portion of the barrier film, greater than or about 20% higher than the hermeticity of a second portion of the barrier film, greater than or about 25% higher than the hermeticity of a second portion of the barrier film, greater than or about 30% higher than the hermeticity of a second portion of the barrier film, greater than or about 40% higher than the hermeticity of a second portion of the barrier film, greater than or about 50% higher than the hermeticity of a second portion of the barrier film, or more. In additional embodiments, a first portion of the silicon-nitride-containing barrier film may have a greater than or about the number of voids as a second and, if included, subsequent portions of the barrier film.

For example, the first portion of the silicon-nitride-containing barrier film may have greater than or about 5% more voids than a second portion of the barrier film, greater than or about 10% more voids than a second portion of the barrier film, greater than or about 15% more voids than a second portion of the barrier film, greater than or about 20% more voids than a second portion of the barrier film, greater than or about 25% more voids than a second portion of the barrier film, greater than or about 50% more voids than a second portion of the barrier film, or more. Additionally, each subsequent film layer may be characterized by a reduction in void formation as previously described. For example, each subsequent layer may be characterized by a linear reduction in voids, in that each previous layer may be characterized by greater than or about 5% more voids than each successive layer, as well as a reduction in voids or bubbles at any of the percentages noted above for voids or hermeticity.

To limit reductions in queue time, plasma treatment operations may be performed within the deposition chamber, and other energy treatments may be performed in a chamber on the same tool as the deposition chamber. By utilizing one or more aspects of the present technology, hydrogen incorporation within a silicon nitride film may be reduced, as well as the number of voids and particles, compared to conventional technologies. Additionally, the processes described may be performed at lower temperatures than many conventional techniques, which may accommodate structures that may be constrained by a thermal budget.

Figure 4:
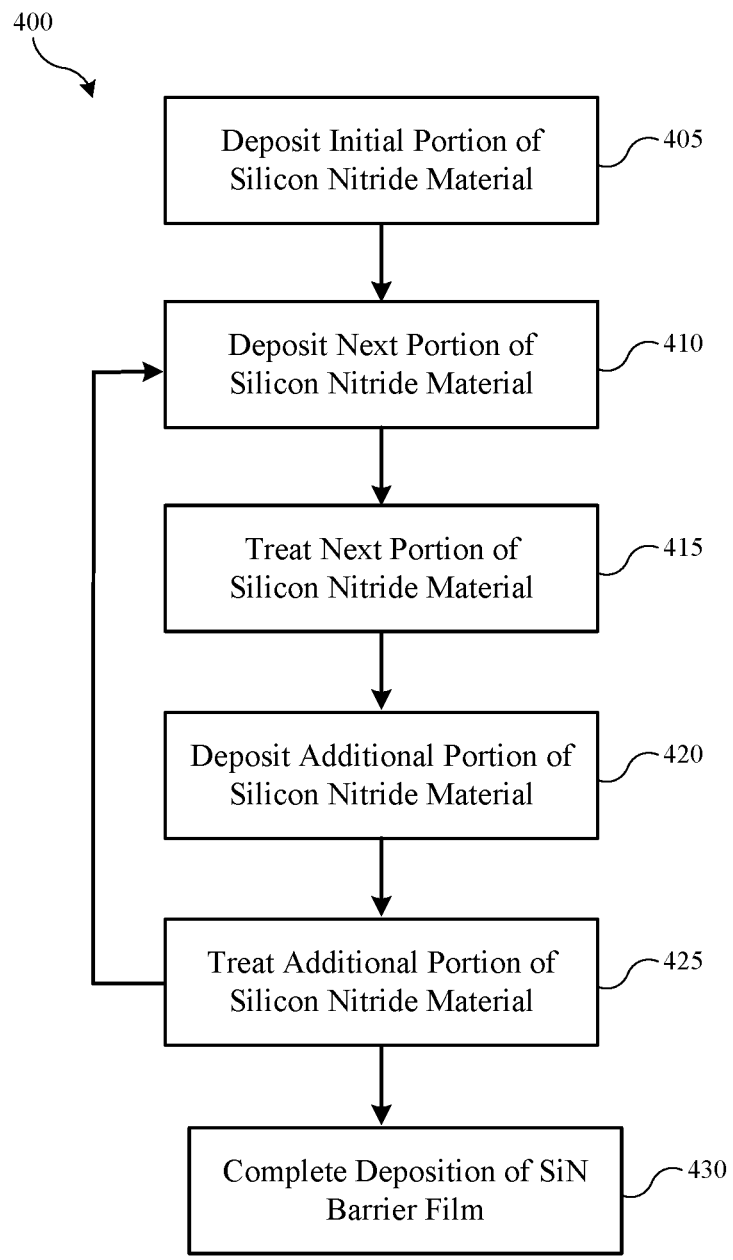
FIG. 4 shows exemplary operations in a processing method according to additional embodiments of the present technology.

FIG. 4 shows exemplary operations in a processing method 400 according to some embodiments of the present technology. The method may be performed in a variety of processing chambers, including plasma system 200 described above. Like method 300 described above, method 400 may include one or more operations prior to the initiation of the stated method operations and one or more operations following the stated method operations. Method 400 may include a deposition of an initial portion of a silicon-nitride-containing material on a substrate 405. This initial portion may take the shape of a relatively thin layer (e.g., 2-5 nm thick) of the silicon nitride material. In some embodiments, the method 400 may further include a treatment operation for the as-deposited, initial portion of the silicon-nitride-containing material. The optional treatment operation (not shown) may include exposing the initial portion of the silicon-nitride-containing material to a low-energy treatment plasma (e.g., 200 Watts or less) that may redistribute the initial portion of material on the substrate without substantially breaking Si—H bonds in the material. The low-energy treatment plasma may be formed from a treatment gas mixture comprising helium and nitrogen gas. The treatment gas mixture may have a helium-to-nitrogen flow rate ratio that is greater than a flow rate ratio of subsequent treatment gas mixtures used in method 400. As noted above, the low-energy treatment plasma does not produce a significant amount of plasma effluents that are energetic enough to break Si—H bonds in the initially-deposited silicon-nitride-containing material. Consequently, while the low-energy treatment plasma is energetic enough to redistribute some of the as-deposited initial material, it does not substantially alter the amount of hydrogen in the material, increase its density, or increase its hermeticity.

Following the deposition, and optional treatment, of the initial portion of the silicon-nitride-containing material on the substrate, method 400 includes two or more deposition and treatment cycles to build up portions of treated silicon-nitride-containing material into a silicon-nitride-containing barrier film. The first of these deposition and treatment cycles includes a deposition of a next portion of silicon-nitride-containing material on the initial portion of silicon-nitride-containing material 410. The deposition operation 410 may include forming a deposition plasma and depositing the next portion of silicon-and-nitrogen-containing material from the plasma's effluents. The as-deposited next portion of silicon-nitride-containing material may be treated with a treatment plasma 415. In contrast to the prior low-energy treatment plasma, the treatment plasma in treatment operation 415 is sufficiently energetic to alter the composition of the as-deposited silicon-nitride-containing material. In some embodiments, the treatment plasma in treatment operation 415 is supplied with the highest power level for a treatment plasma in the deposition and treatment cycles performed in method 400 (e.g., a power level ranging from 600 Watts to 1000 Watts). In some embodiments, the treatment gas mixture that forms the treatment plasma in treatment operation 415 may have a helium-to-nitrogen flow rate ratio that is higher than in any subsequent treatment operation performed in method 400. In each successive treatment operation formed after each additional deposition operation, the plasma power may be further reduced to reduce bubbles within the film layer-to-layer. For example, each successive treatment operation may further reduce the plasma power by greater than or about 40 W, and may reduce the plasma power by greater than or about 50 W, greater than or about 60 W, greater than or about 70 W, greater than or about 80 W, or more. Consequently, a final layer treatment may be performed at a plasma power of less than or about 500 W, and may be performed at less than or about 480 W, less than or about 460 W, less than or about 440 W, less than or about 420 W, less than or about 400 W, less than or about 380 W, less than or about 360 W, less than or about 340 W, less than or about 320 W, or less.

Method 400 is an embodiment of the present technology that further includes at least a second deposition and treatment cycle following the deposition and treatment of the next portion of the silicon-nitride-containing material. The second deposition and treatment cycle includes a deposition of an additional portion of silicon-nitride-containing material 420. The additional portion of the silicon-nitride-containing material may be deposited on the treated next portion of silicon-nitride-containing material. The deposition operation 420 may include forming a deposition plasma from one or more deposition precursors, and depositing the additional portion of silicon-and-nitrogen-containing material from the plasma effluents. In some embodiments, the deposition rate and/or deposition amount for the additional portion of the silicon-and-nitrogen-containing material may be greater than the deposition rate and/or deposition amount for the prior, next portion of the silicon-and-nitrogen-containing material. In some of these embodiments, a flow rate for the deposition precursors supplying the deposition plasma may be greater than the flow rate for the deposition precursors supplying the deposition plasma that formed the previous portion of the silicon nitride-containing material. Embodiments may include an increased flow rate for the silicon-containing precursor (e.g., TSA, silane), and may further include an increased flow rate for a nitrogen-containing precursor (e.g., $NH_3$) if one is included in the deposition precursors. For example, each successive deposition may include a similar or an increased flow rate compared to a previous deposition operation for multiple cycles. For example, in each successive deposition, a flow rate of ammonia or another nitrogen-containing precursor may increase by greater than or about 10 sccm. The as-deposited additional portion of silicon-nitride-containing material may be treated with a treatment plasma 425. The treatment plasma may be formed from the plasma power source set to a lower plasma power level than the power level used to form the treatment plasma that treated the prior, next portion of the silicon-nitride material.

Embodiments of method 400 may further include the completion of a silicon-nitride-containing barrier film 430. In the embodiment shown in method 400 the silicon-nitride-containing barrier film was completed after at least two deposition and treatment cycles following the deposit, and optional treatment, of the initial portion of the silicon-nitride-containing material. The completed silicon-nitride-containing barrier film may include a portion closest to the substrate that has the highest hermeticity, highest density, and lowest hydrogen concentration of any portion of the barrier film. The completed silicon-nitride-containing barrier film may also include a portion furthest away from the substrate that has the highest hydrogen concentration and lowest stress of any portion of the barrier film.

Figure 5A:
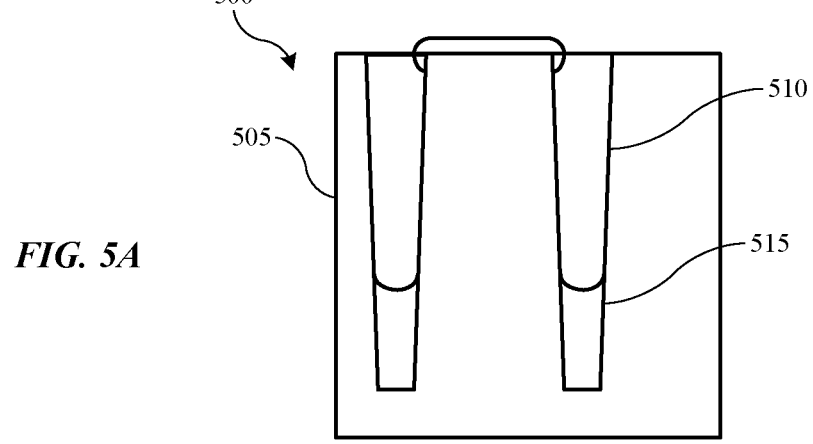
FIGS. 5A & 5B show schematic cross-sectional views of a substrate during a processing according to some embodiments of the present technology.
Figure 5B:
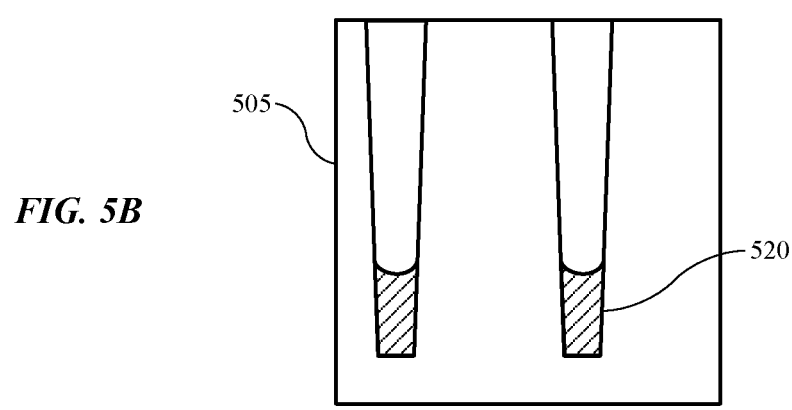

FIGS. 5A & 5B show exemplary schematic cross-sectional views of a substrate during a processing according to some embodiments of the present technology. The cross-sectional views show a portion of a structure 500 after different operations described in processing methods 300 and 400 according to some embodiments of the present technology. Processing chamber 200 may be utilized in some embodiments of the present technology for processing methods 300 and 400 that may include formation and treatment of silicon nitride materials for semiconductor structures. It is to be understood that the chamber described is not to be considered limiting, and any chamber that may be configured to perform operations as described may be similarly used. Methods 300 and 400 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Methods 300 and 400 may describe operations shown schematically in FIGS. 5A & 5B. It is to be understood that the figures illustrate only partial schematic views, and a substrate may contain any number of additional materials and features having a variety of characteristics and aspects as illustrated in the figures.

A substrate on which several operations have been performed may be substrate 505 of a structure 500, which may show a partial view of a substrate on which semiconductor processing may be performed. It is to be understood that structure 500 may show only a few top layers during processing to illustrate aspects of the present technology. The substrate 505 may include a material in which one or more features 510 may be formed. Substrate 505 may be any number of materials used in semiconductor processing. The substrate material may be or include silicon, germanium, dielectric materials including silicon oxide or silicon nitride, metal materials, or any number of combinations of these materials, which may be the substrate 505, or materials formed in structure 500. Features 510 may be characterized by any shape or configuration according to the present technology. In some embodiments, the features may be or include a trench structure or aperture formed within the substrate 505.

Although the features 510 may be characterized by any shapes or sizes, in some embodiments the features 510 may be characterized by higher aspect ratios, or a ratio of a depth of the feature to a width across the feature. For example, in some embodiments features 510 may be characterized by aspect ratios greater than or about 5:1, and may be characterized by aspect ratios greater than or about 10:1, greater than or about 15:1, greater than or about 20:1, greater than or about 25:1, greater than or about 30:1, greater than or about 40:1, greater than or about 50:1, or greater. Additionally, the features may be characterized by narrow widths or diameters across the feature including between two sidewalls, such as a dimension less than or about 20 nm, and may be characterized by a width across the feature of less than or about 15 nm, less than or about 12 nm, less than or about 10 nm, less than or about 9 nm, less than or about 8 nm, less than or about 7 nm, less than or about 6 nm, less than or about 5 nm, or less.

In some embodiments, methods 300 and 400 may include optional treatment operations, such as a pretreatment, that may be performed to prepare a surface of substrate 405 for deposition. Once prepared, methods 300 and 400 may include delivering one or more precursors to a processing region of the semiconductor processing chamber housing the structure 500. The precursors may include one or more silicon-and-nitrogen-containing precursors, as well as one or more diluents or carrier gases such as an inert gas or other gas delivered with the silicon-and-nitrogen-containing precursor. A plasma may be formed of the deposition precursors including the silicon-and-nitrogen-containing precursor at operation 310. The deposition plasma may be formed within the processing region, which may allow silicon nitride deposition materials to deposit on the substrate. For example, in some embodiments a capacitively-coupled plasma may be formed within the processing region by applying plasma power to the faceplate as previously described. The deposition plasma formed may be formed by applying a plasma power to the faceplate or showerhead, and in some embodiments no other power source may be engaged.

As illustrated in FIG. 5A, silicon nitride material 515 may be deposited on the substrate 405, and may deposited into trenches or features 510. As illustrated, the deposited material 515 may be deposited into the bottom of the feature.

As illustrated in FIG. 5B, subsequent an amount of deposition, a treatment operation may be conducted to densify the silicon nitride material, increase the hermeticity of the silicon nitride material, and reduce a hydrogen content of the silicon nitride material. This process may be performed in the same chamber as the deposition. In some embodiments the silicon-and-nitrogen-containing precursor flow may be halted and the processing region may be purged. Subsequent a purge, a treatment precursor may be flowed into the processing region of the processing chamber. A treatment plasma may be formed, which may be a capacitively-coupled plasma formed within the processing region. The treatment operation provides a reduced hydrogen incorporation in the treated silicon nitride material 520, such as a hydrogen incorporation of less than or about 40 at. %, and may provide a reduced hydrogen incorporation of less than or about 35 at. %, less than or about 30 at. %, less than or about 25 at. %, less than or about 20 at. %, less than or about 15 at. %, less than or about 10 at. %, less than or about 5 at. %, or less.

Although the deposition of the as-deposited silicon nitride material may be formed to several nanometers or more, by performing the deposition process as previously described, the thickness of treated silicon nitride material may be controlled to be at a thickness of less than or about 100 Å, and may be less than or about 90 Å, less than or about 80 Å, less than or about 70 Å, less than or about 60 Å, less than or about 50 Å, less than or about 40 Å, less than or about 30 Å, less than or about 20 Å, less than or about 10 Å, or less. By controlling the thickness of each portion of the as-deposited silicon nitride material, penetration issues for the treatment plasma common in conventional processes may be resolved. As illustrated in FIG. 4C, material 415 deposited on the substrate, and in the feature, may be converted to treated silicon nitride material 420 through a full depth of the material. The deposition and treatment operations may then be repeated to continue to produce a complete barrier film on the substrate and/or in the substrate feature.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A processing method comprising:
depositing and treating a first portion of a silicon nitride material on a semiconductor substrate, wherein the first portion of the silicon nitride material is formed with a first deposition plasma and treated with a first treatment plasma;
depositing a second portion of a silicon nitride material on the first treated portion of the silicon nitride material, wherein the second portion of the silicon nitride material is deposited with a second deposition plasma formed of one or more deposition precursors comprising a silicon-containing precursor;
treating the second portion of the silicon nitride material with a second treatment plasma formed of a second treatment gas mixture comprising helium and nitrogen;
depositing a third portion of the silicon nitride material on the second treated portion of the silicon nitride material, wherein the third portion of the silicon nitride material is deposited with a third deposition plasma; and treating the third portion of the silicon nitride material with a third treatment plasma formed of a third treatment gas mixture comprising helium and nitrogen, wherein a flow rate ratio of helium-to-nitrogen for the second treatment gas mixture is greater than a flow rate ratio of helium-to-nitrogen for the third treatment gas mixture.

2. The processing method of claim 1, wherein the first treatment plasma is formed of a first treatment gas mixture comprising helium and nitrogen, and wherein a flow rate ratio of helium-to-nitrogen for the first treatment gas mixture is greater than the flow rate ratio of helium-to-nitrogen for the second treatment gas mixture.

3. The processing method of claim 1, wherein the second treatment plasma is formed with a plasma power source set to a second power level, and the third treatment plasma is formed with the plasma power source set to a third power level, and wherein the second power level is greater than the third power level.

4. The processing method of claim 3, wherein the first treatment plasma is formed with the plasma power source set to a first power level that is less than the second power level and the third power level.

5. The processing method of claim 4, wherein the first power level is 200 Watts or less.

6. The processing method of claim 1, wherein the second deposition plasma is formed with a plasma power source that is operated in a pulsing mode.

7. The processing method of claim 1, wherein the second treatment plasma is formed with a plasma power source that is operated in a continuous wave mode.

8. The processing method of claim 1, wherein the one or more deposition precursors that form the second deposition plasma further comprise a nitrogen-containing precursor.

9. The processing method of claim 8, wherein the nitrogen-containing precursor comprises ammonia or diatomic nitrogen.

10. The processing method of claim 1, wherein the treating of the second portion of the silicon nitride material with the second treatment plasma comprises densifying the second portion of the silicon nitride material, increasing a hermeticity of the second portion of the silicon nitride material, and reducing a hydrogen content of the second portion of the silicon nitride material.

11. The processing method of claim 1, wherein the silicon-containing precursor comprises at least one of silane and an amino silane.

12. The processing method of claim 1, wherein the second portion of the silicon nitride material has a thickness less than the third portion of the silicon nitride material.

13. A processing method comprising:
performing two or more cycles of depositing and treating silicon nitride material on a semiconductor substrate;
wherein each of the two or more cycles of depositing and treating the silicon nitride material comprises:
depositing a silicon nitride material with plasma effluents of a deposition plasma, wherein the deposition plasma is formed of one or more deposition precursors comprising a silicon-containing precursor; and
treating the silicon nitride material with a treatment plasma, wherein the treatment plasma is formed of a treatment gas mixture comprising helium and nitrogen,
wherein a flow rate ratio of helium-to-nitrogen for the treatment gas mixture in a prior cycle of depositing and treating silicon nitride material is greater than a flow rate ratio of helium-to-nitrogen for the treatment gas mixture in a subsequent cycle of depositing and treating silicon nitride material.

14. The processing method of claim 13, wherein the treatment plasma is formed with a plasma power source, and wherein the plasma power source is set to a power level for the prior cycle of depositing and treating silicon nitride material that is greater than a power level for the subsequent cycle of depositing and treating silicon nitride material.

15. The processing method of claim 14, wherein the semiconductor substrate comprises an initial layer of silicon nitride material deposited in the substrate feature.

16. The processing method of claim 15, wherein the initial layer of silicon nitride material is deposited with a first deposition plasma formed of a silicon-containing deposition precursor, and treated with a first treatment plasma formed of a first treatment gas mixture comprising helium and nitrogen, and wherein:
the first treatment gas has a flow rate ratio of helium-to-nitrogen that is greater than the flow rate ratio of helium-to-nitrogen for the treatment gas mixture in previous and subsequent cycles of depositing and treating silicon nitride material; and
the first treatment plasma is formed with a plasma power source set to a first power level that is 200 Watts or less.

17. The processing method of claim 13, wherein the one or more deposition precursors comprise the silicon-containing precursor and ammonia.

18. A processing method comprising:
depositing a first portion of a silicon nitride material on a semiconductor substrate with a first deposition plasma;
treating the first portion of the silicon nitride material with a first treatment plasma formed of a first treatment gas mixture comprising helium and nitrogen, wherein the first treatment plasma does not substantially reduce an amount of hydrogen in the first portion of the silicon nitride material;
depositing a second portion of a silicon nitride material on the first treated portion of the silicon nitride material, wherein the second portion of the silicon nitride material is deposited with a second deposition plasma;
treating the second portion of the silicon nitride material with a second treatment plasma formed of a second treatment gas mixture comprising helium and nitrogen, wherein the second treatment plasma reduces an amount of hydrogen in the second portion of the silicon nitride material as deposited.

19. The processing method of claim 18, wherein the first treatment plasma is formed with a plasma power source set to a first power level that is 200 Watts or less, and the second treatment plasma is formed with the plasma power source set to a second power level of 500 Watts or more.

20. The processing method of claim 19, wherein the first treatment gas mixture has a first flow rate ratio of helium-to-nitrogen that is greater than a second flow rate ratio of helium-to-nitrogen for the second treatment gas mixture.

* * * * *